United States Patent
Hilliker et al.

(10) Patent No.: US 7,042,311 B1
(45) Date of Patent: May 9, 2006

(54) RF DELIVERY CONFIGURATION IN A PLASMA PROCESSING SYSTEM

(75) Inventors: Stephen E. Hilliker, Tualatin, OR (US); Anthony E. Sebastian, Livermore, CA (US); Yan Rubin, Fremont, CA (US); George Thomas, Fremont, CA (US)

(73) Assignee: Novellus Systems, Inc., San Jose, CA (US)

(*) Notice: Subject to any disclaimer, the term of this patent is extended or adjusted under 35 U.S.C. 154(b) by 58 days.

(21) Appl. No.: 10/683,566

(22) Filed: Oct. 10, 2003

(51) Int. Cl.
*H01L 41/00* (2006.01)

(52) U.S. Cl. ........................ 333/133; 333/17.3; 333/33

(58) Field of Classification Search ................ 333/133, 333/17.3, 32
See application file for complete search history.

(56) References Cited

U.S. PATENT DOCUMENTS

| | | | |
|---|---|---|---|
| 3,805,165 A * | 4/1974 | Hoffman ..................... 455/313 |
| 4,629,940 A * | 12/1986 | Gagne et al. ............ 315/111.51 |
| 4,812,712 A | 3/1989 | Onishi et al. |
| 4,824,546 A | 4/1989 | Ohmi |
| 5,110,438 A | 5/1992 | Ohmi et al. |
| RE34,106 E | 10/1992 | Ohmi |
| 5,187,457 A | 2/1993 | Chawla et al. |
| 5,392,018 A * | 2/1995 | Collins et al. ............... 336/155 |
| 5,653,811 A | 8/1997 | Chan |
| 5,660,694 A | 8/1997 | Ohmi et al. |
| 5,747,935 A | 5/1998 | Porter et al. |
| 5,849,136 A | 12/1998 | Mintz et al. |
| 5,892,198 A * | 4/1999 | Barnes et al. ............ 219/121.54 |
| 6,036,878 A * | 3/2000 | Collins ........................ 216/68 |
| 6,046,546 A | 4/2000 | Porter et al. |
| 6,063,234 A | 5/2000 | Chen et al. |
| 6,252,354 B1 * | 6/2001 | Collins et al. ........... 315/111.51 |
| 6,259,334 B1 * | 7/2001 | Howald ..................... 333/17.3 |
| 6,361,645 B1 | 3/2002 | Schoepp et al. |
| 6,424,232 B1 * | 7/2002 | Mavretic et al. ........... 333/17.3 |
| 6,474,257 B1 * | 11/2002 | Jeng ......................... 118/723 I |
| 6,516,742 B1 * | 2/2003 | Blalock et al. ............ 118/723 I |
| 6,552,297 B1 * | 4/2003 | Blonigan et al. ........ 219/121.43 |
| 6,577,113 B1 | 6/2003 | Sill et al. |
| 6,630,792 B1 | 10/2003 | Okumura |
| 6,631,693 B1 | 10/2003 | Hilliker |
| 6,677,711 B1 * | 1/2004 | MacGearailt .......... 315/111.21 |
| 6,705,246 B1 * | 3/2004 | Sharan et al. ............ 118/723 E |
| 6,753,689 B1 | 6/2004 | Thomas |
| 6,917,204 B1 * | 7/2005 | Mitrovic et al. ............. 324/464 |

FOREIGN PATENT DOCUMENTS

| | | |
|---|---|---|
| JP | 62-136112 | 6/1987 |
| JP | 62-171233 | 7/1987 |
| JP | 03-165110 | 7/1991 |
| JP | 08-204472 | 8/1996 |

* cited by examiner

*Primary Examiner*—Robert Pascal
*Assistant Examiner*—Kimberly Glenn
(74) *Attorney, Agent, or Firm*—Okamoto & Benedicto LLP

(57) ABSTRACT

In one embodiment, a system for delivering radio frequency (RF) power to a plasma processing system includes an automatic impedance matching network configured to receive RF power from an RF generator, and a fixed impedance matching network coupled between the automatic impedance matching network and the plasma processing chamber. The fixed impedance matching network may be configured to transform a first impedance presented by the chamber to a second impedance that allows the automatic impedance matching network to operate within a tuning range.

31 Claims, 9 Drawing Sheets

RF DELIVERY CONFIGURATION IN A PLASMA PROCESSING SYSTEM

BACKGROUND OF THE INVENTION

1. Field of the Invention

This invention relates generally to plasma processing systems, and more particularly to radio frequency (RF) power generation and distribution in such systems.

2. Description of the Background Art

Plasma processing systems are employed in the fabrication of semiconductor devices. In a plasma processing system, such as a plasma enhanced chemical vapor deposition (PECVD) system, radio frequency (RF) power is supplied to the system's chamber to maintain a plasma therein. A semiconductor substrate in the chamber is exposed to the plasma and process gases, thereby performing a fabrication process on the substrate. In a PECVD system, for example, the fabrication process may be deposition of a thin film of dielectric material on the substrate.

FIG. 1 shows a schematic diagram of a typical RF delivery configuration. In the configuration of FIG. 1, an RF generator 101 is coupled to one or more electrodes in a plasma processing chamber 105. RF generator 101 may be a so-called "high-frequency" RF generator operating at a frequency of about 13.56 MHz and having an output impedance of about 50 Ω (Ohms). RF generator 101 is coupled to plasma processing chamber 105 via a 50 Ω coaxial cable 102. Coaxial cable 102 typically has a fixed length specifically selected for the characteristics required by plasma processing chamber 105.

To prevent power loss due to signal reflection, impedance matching network 103 performs an impedance transformation to match the load impedance presented by plasma processing chamber 105 to the characteristic impedance of cable 102. Impedance matching network 103 may be an automatic impedance matching network or a fixed impedance matching network. An automatic impedance matching network, which is also referred to as an "auto-match," is so named because it employs tuning components that are automatically adjusted in response to the impedance presented to it. A fixed impedance matching network, which is also referred to as a "fixed-match," is so named because it employs components that are not adjusted during normal operation. That is, the components of a fixed-match have preset values. A matching network 103 may be connected to an electrode in plasma processing chamber 105 using a connection scheme 104, which may include combiners, splitters, direct connections using electrically conductive elements, or combinations thereof.

The load impedance presented by a plasma processing chamber can have relatively high phase angles, which can lead to high circulating currents and RF delivery stability issues. Matching network 103 thus requires components that can handle high circulating currents, thereby increasing the cost of matching network 103. The high load currents also raise reliability issues by degrading the components of matching network 103, lower the efficiency of matching network 103 because of $I^2R$ power losses, and prevent accurate voltage-current probe readings between matching network 103 and the chamber.

In the example of FIG. 1, matching network 103 is customized to the load impedance presented by chamber 105. Thus, a manufacturer offering different models or types of plasma processing chambers may have to design, manufacture, and stock different matching networks 103. This not only increases the overall cost of the plasma processing system, but also raises logistical issues.

SUMMARY

In one embodiment, a system for delivering radio frequency (RF) power to a plasma processing system includes an automatic impedance matching network configured to receive RF power from an RF generator, and a fixed impedance matching network coupled between the automatic impedance matching network and the plasma processing chamber. The fixed impedance matching network may be configured to transform a first impedance presented by the chamber to a second impedance that allows the automatic impedance matching network to operate within a tuning range.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided such as examples of apparatus, circuits, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 2:
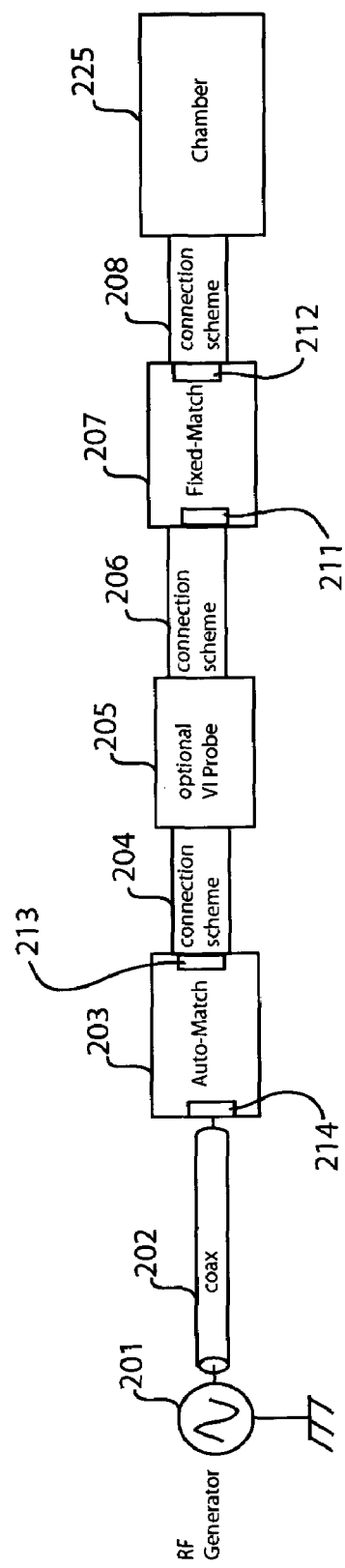
FIG. 2 shows a schematic diagram of an RF delivery configuration in accordance with an embodiment of the present invention.

Referring now to FIG. 2, there is shown a schematic diagram of an RF delivery configuration in accordance with an embodiment of the present invention. In the example of FIG. 2, an RF generator 201 is coupled to a plasma processing chamber 225 via a coaxial cable 202, an automatic impedance matching network 203 ("auto-match 203"), a connection scheme 206 (e.g., a coaxial cable), a fixed matching network 207 ("fixed-match 207"), and a connection scheme 208. In one embodiment, RF generator 201 is a commercially available high-frequency RF generator operating at a frequency of about 13.56 MHz and having an output impedance of about 50 Ω (Ohms). A coaxial cable 202 couples RF generator 201 to the rest of the system. To minimize reflections, coaxial cable 202 has a characteristic impedance that matches the output impedance of RF generator 201. In one embodiment, the characteristic impedance of coaxial cable 202 is about 50 Ω. As can be appreciated, the coaxial cables disclosed herein may also be replaced with other connection schemes.

In one embodiment, plasma processing chamber 225 is a chamber that employs a plasma in the fabrication of integrated circuits. For example, plasma processing chamber 225 may be a plasma-enhanced chemical vapor deposition (PECVD) or a high-density plasma chemical vapor deposition (HDP-CVD) chamber. Plasma processing chamber 225 may be a commercially available plasma processing chamber such those available from Novellus Systems, Inc. of San Jose, Calif.

Figure 1:
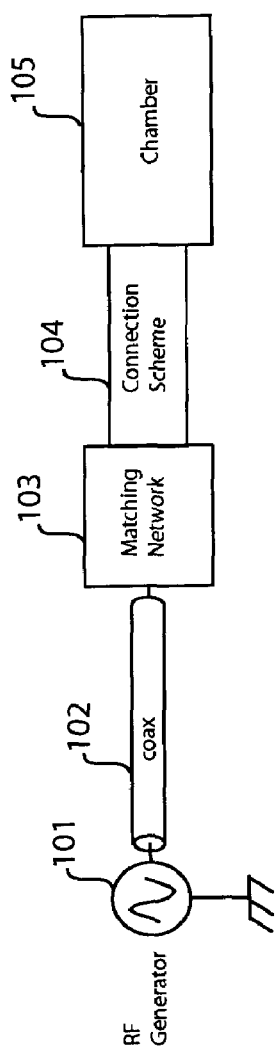
FIG. 1 shows a schematic diagram of a typical RF delivery configuration.

Plasma processing chamber 225 typically presents a load impedance that is not matched to the output impedance of RF generator 201 and the characteristic impedance of intervening coaxial cables. To minimize reflections and to alleviate the problems discussed in connection with the configuration of FIG. 1, fixed-match 207 is employed between plasma processing chamber 225 and an auto-match 203. Fixed-match 207 sees the load impedance presented by plasma processing chamber 225 at a node 212 and transforms that load impedance to another impedance at a node 211. In one embodiment, the impedance presented by fixed-match 207 at node 211 allows auto-match 203 to operate within a tuning range. Fixed-match 207 beneficially isolates the rest of the system from the relative low load impedance presented by plasma processing chamber 225, thereby allowing auto-match 203 to be constructed using lower cost components, allowing for the use of a voltage-current (VI) probe between fixed-match 207 and auto-match 203, and alleviating issues relating to high phase angles of load currents including RF delivery stability issues, component degradation and $I^2R$ power losses.

Connection scheme 208 connects fixed-match 207 to plasma processing chamber 225. Connection scheme 208 may comprise electrically conducting elements directly connecting fixed-match 207 to an electrode in plasma processing chamber 225. Depending on the application, connection scheme 208 may also include combiners, splitters, and other means for connecting fixed-match 207 to an electrode in plasma processing chamber 225. Various connection schemes 208 may be employed without detracting from the merits of the present invention.

Connection scheme 206 couples fixed-match 207 to other components downstream from node 211. The characteristic impedance of connection scheme 206 is selected to minimize reflections. In one embodiment where the fixed-match 207 presents an impedance between 10 Ω to 90 Ω at node 211, connection scheme 206 may be a coaxial cable having a characteristic impedance of about 30 Ω. Connection scheme 206 may have a relatively short (e.g., less than 8 feet), predetermined fixed length, for example. A connection scheme, such as connection scheme 206, having a characteristic impedance lower than the standard 50 Ω advantageously allows for higher power handling. The relatively short length of connection scheme 206 helps minimize power loss.

A voltage-current probe ("VI probe") measures voltage, current, and phase, and may thus be employed as a troubleshooting or process control tool. Because a typical VI probe provides inaccurate readings in high phase angle environments, VI probes are not effective when employed "in front" of a plasma processing chamber. In the example of FIG. 2, fixed-match 207 protects a VI probe from the high phase angles of plasma processing chamber 225 and the high load currents associated with such load impedance. This allows VI probe 205 to be coupled between auto-match 203 and fixed-match 207. Of course, the use of VI probe 205 is optional. Preferably, VI probe 205 comprises a non-invasive, commercially available VI probe that is generally employed in the 50 Ω side of plasma processing applications. A non-invasive VI probe 205 allows auto-match 203 to see the impedance presented by fixed-match 207 as if VI probe 205 is not coupled between them. VI probe 205 may be connected to fixed match 207 via connection scheme 206, and to auto-match 203 via a connection scheme 204. In one embodiment, connection scheme 204 comprises a removable stub. The stub may be a connection scheme consisting of adapters placed between two terminals. The stub may be removed to allow VI probe 205 to be installed in its place. Other means for connecting VI probe 205 to auto-match 203 may also be employed without detracting from the merits of the present invention.

Auto-match 203 transforms the impedance present at its node 213 to an impedance that matches the characteristic impedance of coaxial cable 202 and the output impedance of RF generator 201. Auto-match 203 may comprise an auto-match 203A shown in FIG. 3A or an auto-match 203B shown in FIG. 3B. In one embodiment where the characteristic impedance of coaxial cable 202 and the output impedance of RF generator 201 is about 50 Ω, the impedance presented by auto-match 203 at node 214 is also about 50 Ω. Auto-match 203 employs components that are automatically tuned to perform this impedance transformation. Fixed-match 207 protects auto-match 203 from the high phase angle and low load impedance of plasma processing chamber 225 and the high load currents associated with such load impedance. This allows auto-match 203 to be implemented using lower cost component and allows it to reliably operate.

Fixed-match 207 presents an impedance at node 211 that is within the tuning range of auto-match 203. In other words, fixed-match 207 transforms the impedance seen at node 212 to within the tuning range of auto-match 203. In one embodiment where auto-match 203 is configured to operate within a minimum tuning range of around a 30 Ω3:1 VSWR circle, fixed-match 207 is configured to present an impedance of about 10 Ω to 90 Ω at node 211. A fixed-match may be customized to present a target impedance or range for a particular plasma processing chamber. Thus, by providing a particular fixed-match for a particular plasma processing chamber, a single auto-match may be employed for different plasma processing chambers. That is, a single auto-match design may be employed to work with different plasma processing chambers by providing a custom fixed-match for each type of chamber. As will be more apparent below, this is advantageous because a fixed-match has cheaper and less components compared to an auto-match. Also, unlike an auto-match, a fixed-match has few or no moving parts.

Figure 3A:
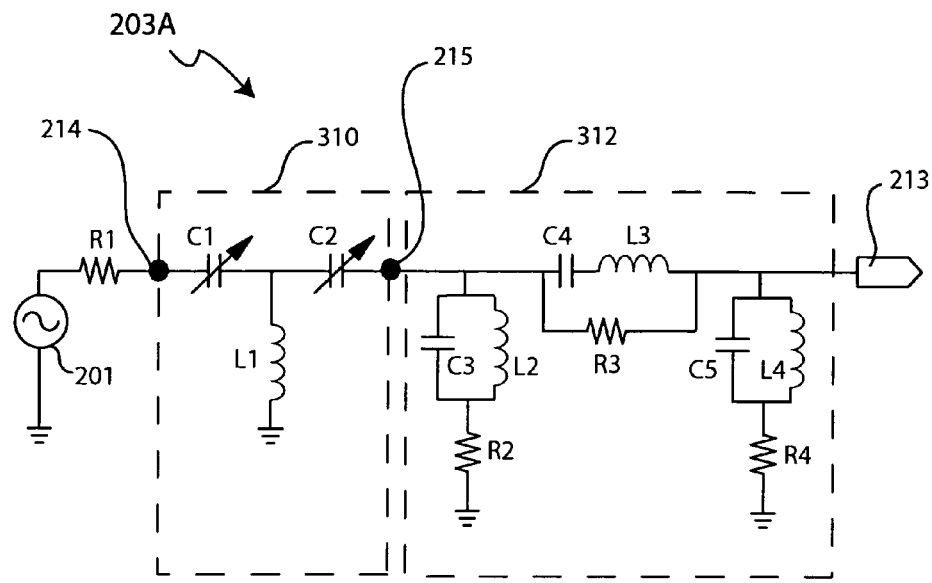
FIG. 3A shows a schematic diagram of an automatic impedance matching network in accordance with an embodiment of the present invention.

FIG. 3A shows a schematic diagram of an auto-match 203A in accordance with an embodiment of the present invention. Auto-match 203A is a specific embodiment of auto-match 203 shown in FIG. 2. Auto-match 203A may include an automatic impedance matching circuit 310 (auto-matching circuit 310) and an absorptive filter circuit 312. In the example of FIG. 3A, resistor R1 represents the output impedance of RF generator 201, which is about 50 Ω in one embodiment.

Auto-matching circuit 310 comprises components that are automatically adjusted to transform the impedance seen at a node 215 to another impedance presented at node 214. The range within which the components of auto-matching circuit 310 may be adjusted to present a target impedance at node 214 is also referred to as a "tuning range." Auto-matching circuit 310 may be automatically tuned to match to the characteristic impedance of cable 202 and the output impedance of RF generator 201. In one embodiment, auto-matching circuit 310 comprises variable capacitors C1 and C2, and an inductor L1. Capacitors C1 and C2 may include moveable plates that may be adjusted to change their capacitance. A monitoring circuit (not shown) comprising a detection circuit commands motors (not shown) to move tuning elements, thereby changing their value to keep auto-matching circuit 310 operating within its tuning range.

In one embodiment, auto-match 203A includes an absorptive filter 312. Absorptive filter 312 allows energies at a fundamental frequency to pass while absorbing energies at frequencies away from the fundamental frequency. Absorptive filter 312 may be configured to pass energies at a fundamental frequency of the output signal of RF generator 201, which is 13.56 MHz in one embodiment. Energies away from the fundamental frequency are absorbed by absorptive filter 312 by dissipating them in a resistive element, such as resistor R2 or R4.

In the example of FIG. 3A, capacitor C4, inductor L3, and resistor R3 form a parallel-series resonant circuit that allows energies at the fundamental frequency to pass but rejects residual energies at frequencies that are away from the fundamental frequency. A parallel resonant circuit with a resistive element for dissipating energies at frequencies away from the fundamental frequency are shown as comprising capacitor C3, inductor L2, and resistor R2 on one end, and comprising capacitor C5, inductor L4, and resistor R4 on another end. At the fundamental frequency, parallel resonant circuit comprising capacitor C3 and inductor L2 and parallel resonant circuit comprising r capacitor C5 and inductor L4 appear as high impedance paths to ground and do not affect the RF power. At frequencies away from the fundamental frequency, the parallel resonant circuit shunts energies to resistor R2 (or resistor R4), which dissipates the energies. Absorptive filter circuit 312 helps minimize variations in the supplied RF power, and helps prevent fabrication processes from shifting. Absorptive filter circuits are also disclosed in commonly-assigned U.S. application Ser. No. 09/774,446, filed by Stephen E. Hilliker on Jan. 30, 2001, which is incorporated herein by reference in its entirety.

In one embodiment where absorptive filter 312 is configured to allow energies at a fundamental frequency of 13.56 MHz to pass and reject energies at harmonic frequencies, and auto-matching circuit 310 has a tuning range around 30 Ω 3:1 VSWR circle, the components of auto-match 203A have the approximate values shown in Table 1.

TABLE 1

EXAMPLE COMPONENT VALUES OF AN AUTO-MATCH

| Component | Value |
|---|---|
| C1 | 66.84 pF to 100 pF |
| C2 | 55.74 pF to 92.3 pF |
| C3 | 391 pF |
| C4 | 390 pF |
| C5 | 391 pF |
| L1 | 1.04 μH |
| L2 | 352 nH |
| L3 | 352 nH |
| L4 | 352 nH |
| R2 | 30 Ω |
| R3 | 30 Ω |
| R4 | 30 Ω |

Figure 3B:
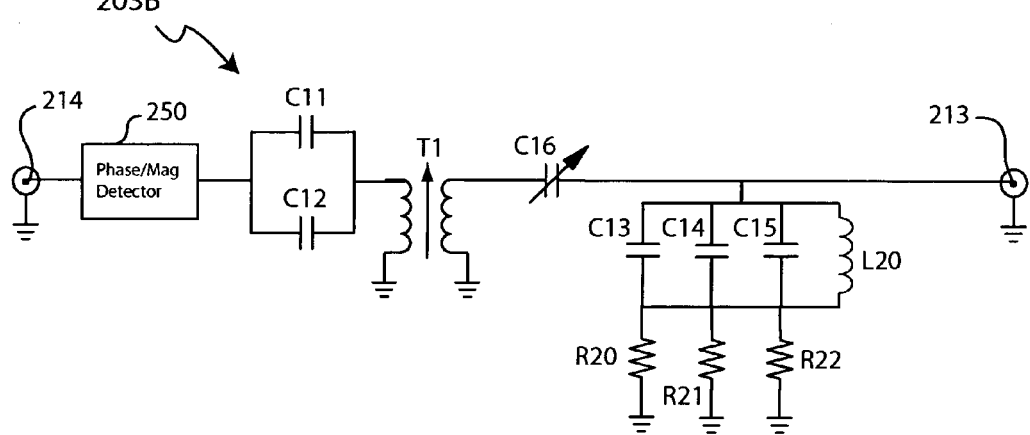
FIG. 3B shows a schematic diagram of an automatic impedance matching network in accordance with another embodiment of the present invention.

FIG. 3B shows a schematic diagram of an auto-match 203B in accordance with another embodiment of the present invention. Auto-match 203B is a specific embodiment of auto-match 203 shown in FIG. 2. Similar to auto-match 203A, auto-match 203B includes components that are automatically adjusted based on readings of a phase/magnitude detector 250 to transform the impedance seen at node 213 to another impedance presented at node 214. Auto-match 203B includes a "single leg" absorptive filter comprising capacitors C13–15, inductor L20, and resistors R20–22. The values of the components of auto-match 203B may be selected based on a tuning range and target absorptive filter characteristics.

Figure 4A:
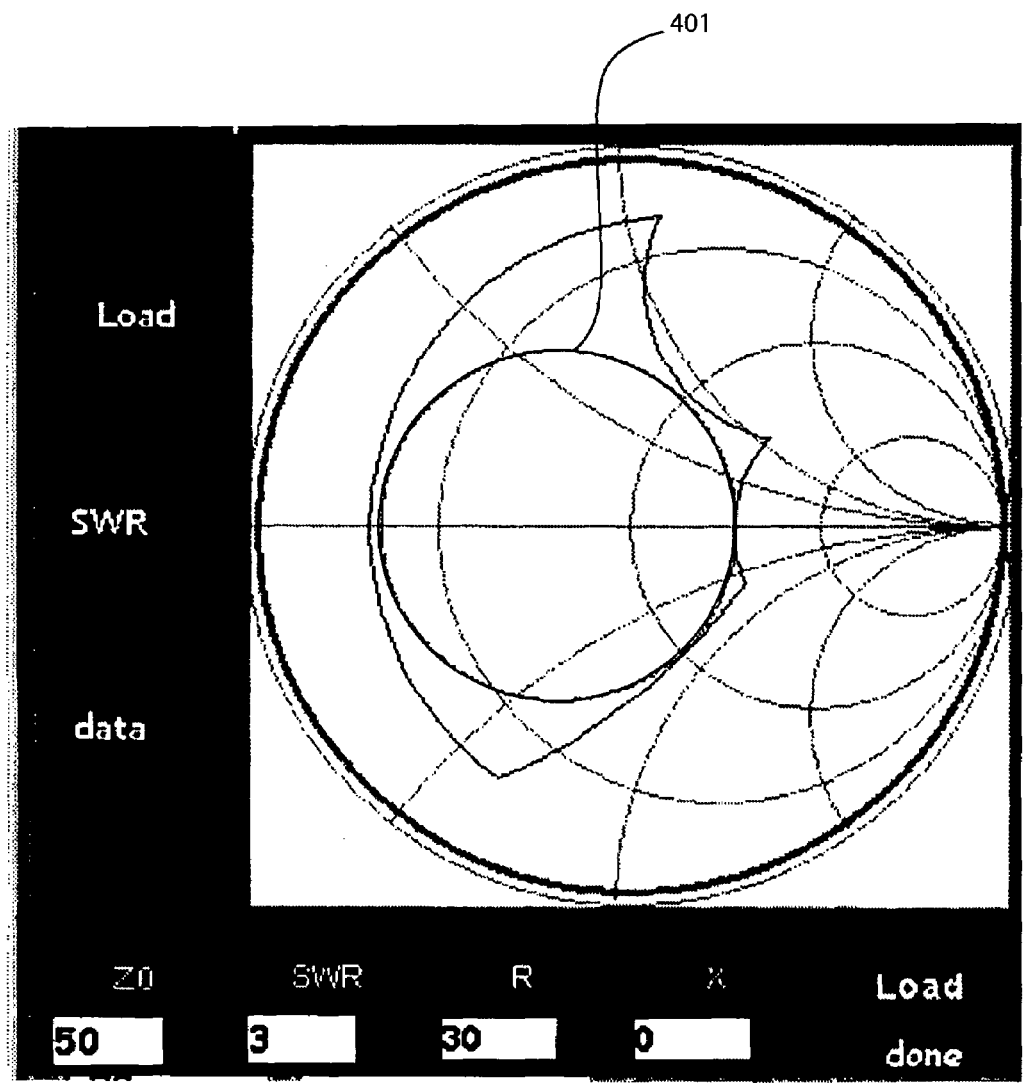
FIG. 4A shows a minimum tuning range in a Smith chart for an automatic impedance matching network in accordance with an embodiment of the present invention.

FIG. 4A shows a minimum tuning range in a Smith chart for an auto-match 203 in accordance with an embodiment of the present invention. In the example of FIG. 4A, the auto-match 203 is configured to present an impedance of about 50 Ω at node 214 (see FIG. 2), and has a tuning range centered at about 30 Ω at node 213. The VSWR circle 401 represents the minimum tuning range of an auto-matching circuit (e.g., see auto-matching circuit 310 in FIG. 3A) within the auto-match 203, which is a 3:1 VSWR circle around 30 Ω in this example. Because an absorptive filter (e.g., see absorptive filter 312 in FIG. 3A) has no appreciable effect on the tuning range of an auto-matching circuit, the tuning range of the auto-matching circuit is the tuning range of the auto-match 203.

Figure 4B:
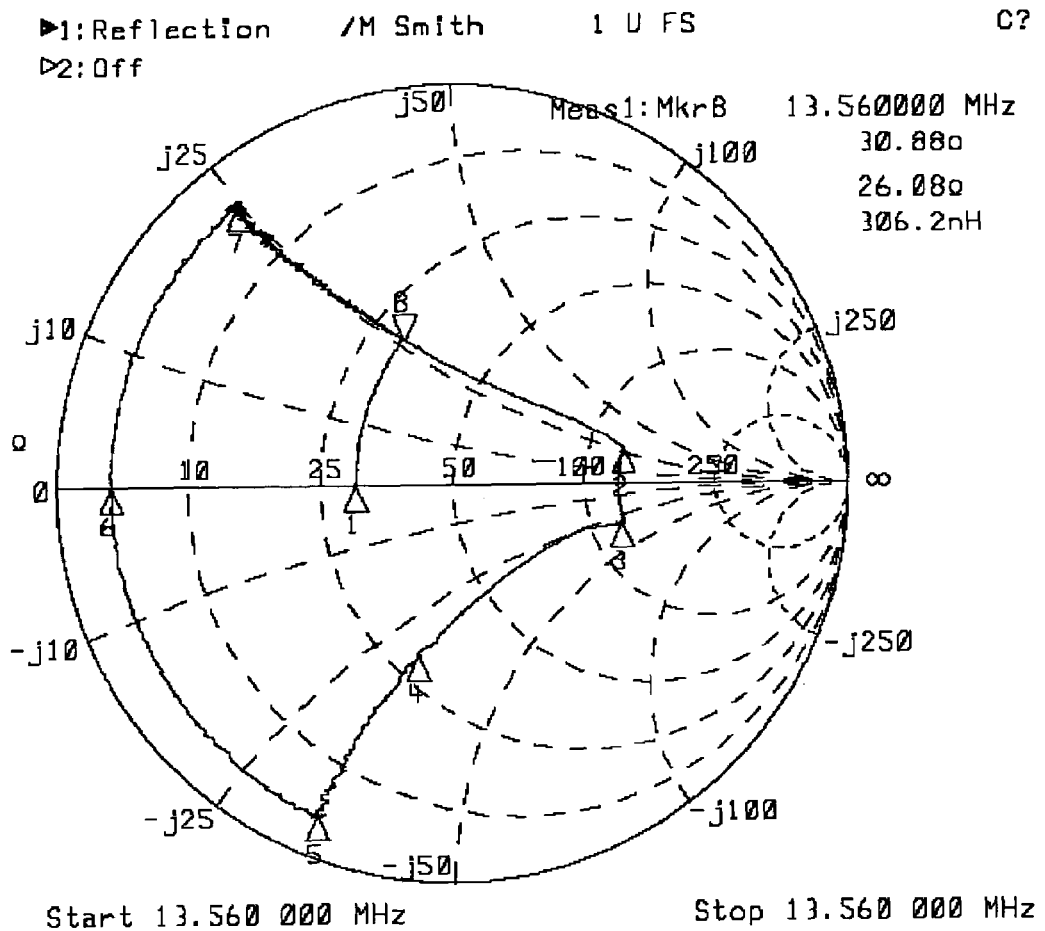
FIG. 4B shows a tuning range in a Smith chart for an automatic impedance matching network in accordance with another embodiment of the present invention.
Figure 4C:
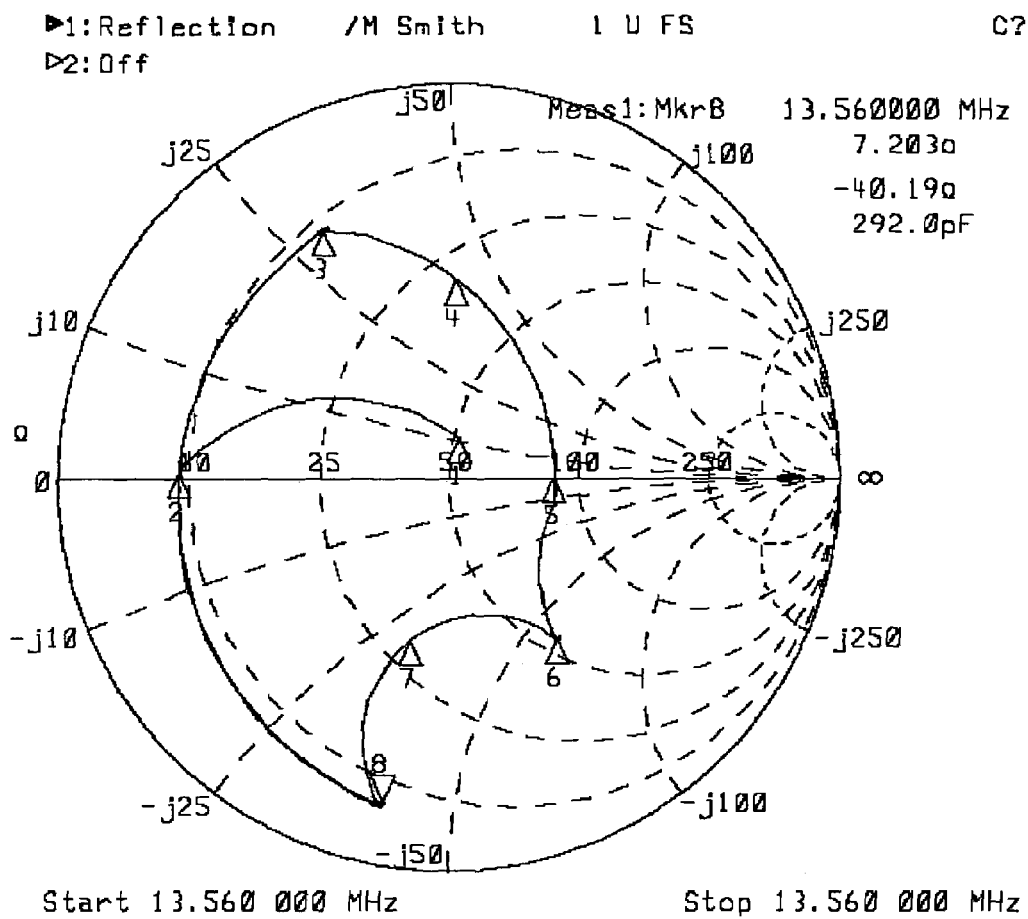
FIG. 4C shows a tuning range in a Smith chart for an automatic impedance matching network in accordance with another embodiment of the present invention.

As can be appreciated, the tuning range of an auto-match 203 may be varied to meet the needs of specific applications. In the example Smith chart of FIG. 4B, the minimum tuning range of an auto-match 203 has been extended to cover lower resistance values. FIG. 4C shows another example tuning range in a Smith chart for an auto-match 203.

Figure 5A:
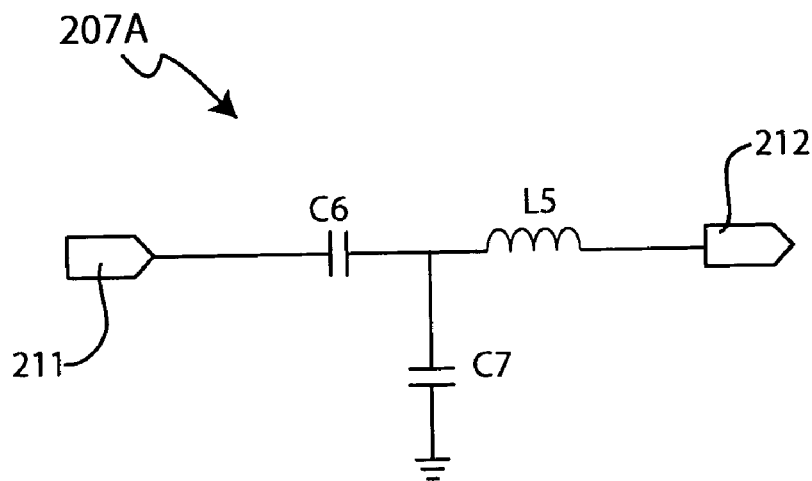
FIG. 5A shows a fixed impedance matching network in accordance with an embodiment of the present invention.

FIG. 5A shows a fixed-match 207A in accordance with an embodiment of the present invention. Fixed-match 207A is a specific embodiment of fixed match 207 shown in FIG. 2. Fixed-match 207A is configured to transform the impedance presented by plasma processing chamber 225 at node 212 to an impedance that is within the tuning range of an auto-match 203 at node 211. That is, fixed-match 207A may be configured to present an impedance that is within the tuning range of auto-match 203. In one embodiment where auto-match 203 has a tuning range of 3:1 VSWR circle around 30 Ω, the components of fixed-match 207A have the values shown in Table 2.

TABLE 2

EXAMPLE COMPONENT VALUES OF A FIXED MATCH

| Component | Value |
|---|---|
| C6 | 750 pF |
| C7 | 1000 pF |
| L5 | 0.1 µH |

Figure 5B:
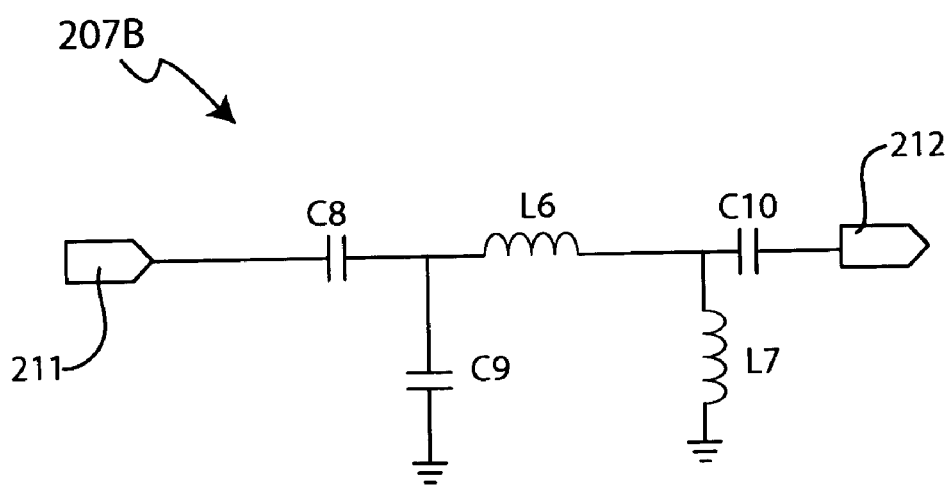
FIG. 5B shows a fixed impedance matching network in accordance with another embodiment of the present invention.

FIG. 5B shows a fixed-match 207B in accordance with another embodiment of the present invention. Fixed-match 207B is a specific embodiment of fixed match 207 shown in FIG. 2. Fixed-match 207B is configured to transform the impedance presented by plasma processing chamber 225 at node 212 to an impedance that is within the tuning range of an auto-match 203 at node 211. That is, fixed-match 207B may be configured to present an impedance that is within the tuning range of auto-match 203. In one embodiment where auto-match 203 has a tuning range of 3:1 VSWR circle around 30 Ω, the components of fixed-match 207B have the values shown in Table 3.

TABLE 3

EXAMPLE COMPONENT VALUES OF A FIXED MATCH

| Component | Value |
|---|---|
| C8 | 600 pF |
| C9 | 275 pF |
| C10 | 2200 pF |
| L6 | 0.216 µH |
| L7 | 0.184 µH |

Figure 6:
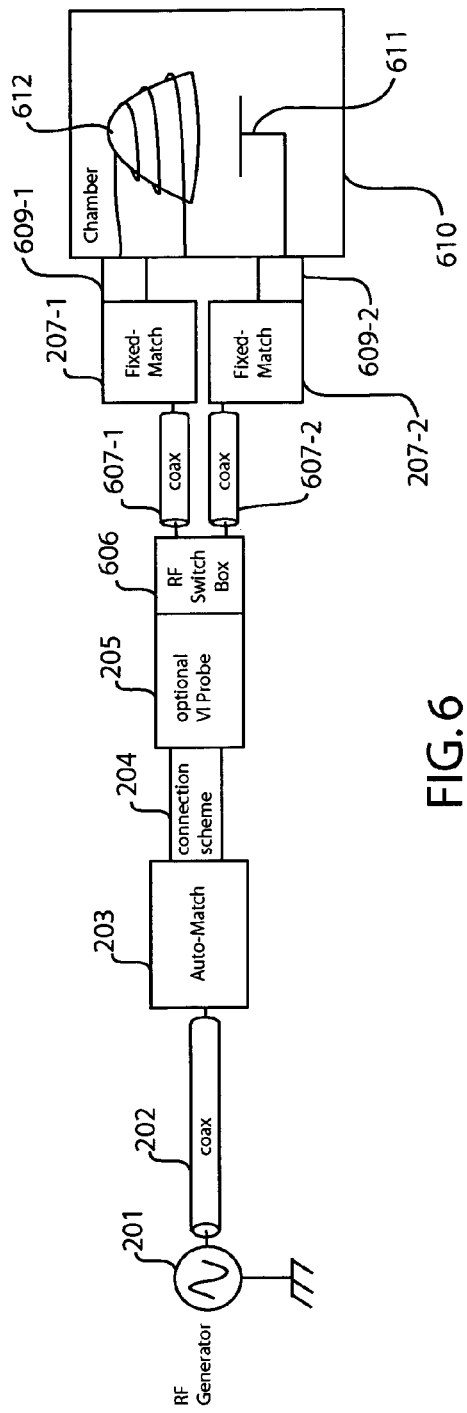
FIG. 6 shows a schematic diagram of an RF delivery configuration in accordance with another embodiment of the present invention.

In light of the present disclosure, those of ordinary skill in the art will appreciate that the use of a fixed-match in conjunction with an auto-match as described herein may be adapted to work with other RF delivery configurations. For example, FIG. 6 shows a schematic diagram of an RF delivery configuration in accordance with another embodiment of the present invention. In the example of FIG. 6, RF generator 201 supplies RF power to either a dome 612 or an electrostatic chuck 611 of a plasma processing chamber 610. Plasma processing chamber 610 may be an HDP-CVD chamber such as those of the type available from Novellus Systems, Inc., for example. Other types of plasma processing chambers may also be employed without detracting from the merits of the present invention. For example, dome 612 or chuck 611 may be other types of electrodes in a plasma processing chamber.

Still referring to FIG. 6, an RF switch box 606 allows RF power from RF generator 201 to be switched between chuck 611 and dome 612, each of which has a corresponding fixed match 207 (i.e., 207-1, 207-2). A coaxial cable 607 (i.e., 607-1, 607-2), which may be a relatively short 300 cable, connects RF switch box 606 to the selected fixed-match 207. Each fixed-match 207 may be connected to its corresponding electrode (i.e., dome 612 or chuck 611) via a connection scheme 609 (i.e., 609-1, 609-2). Connection scheme 609 may be an RF conductor, for example. Depending on the setting of RF switch box 606, auto-match 203 will work with either fixed-match 207-1 or fixed-match 207-2. RF generator 201, coaxial cable 202, auto-match 203, connection scheme 204, and VI probe 205 function as in the configuration of FIG. 2.

Figure 7:
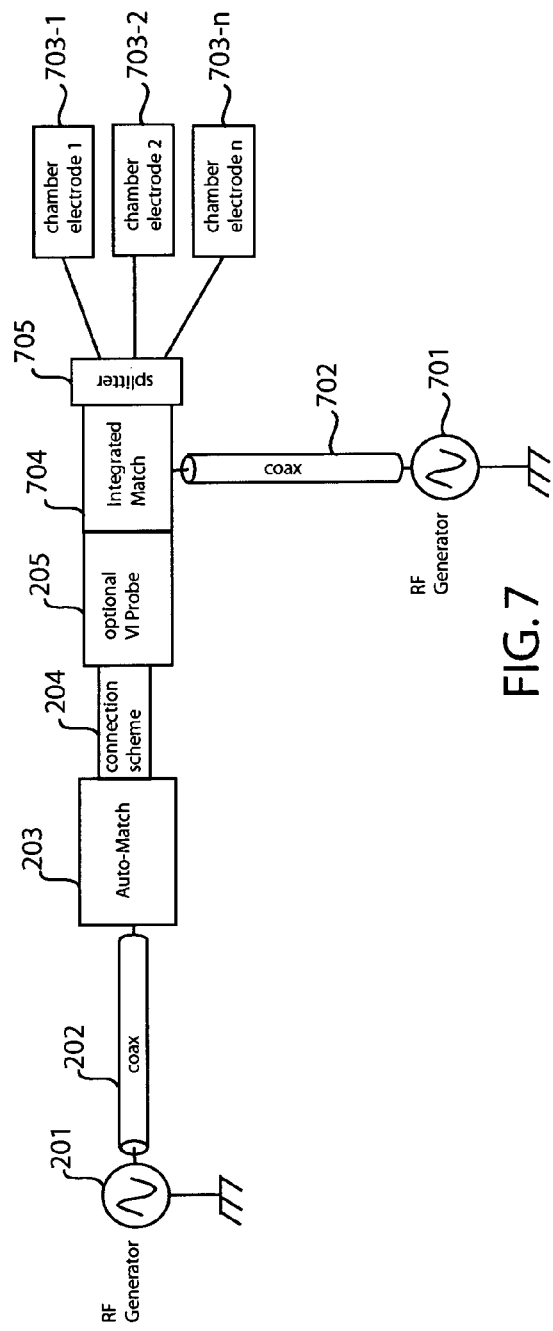
FIG. 7 shows a schematic diagram of an RF delivery configuration in accordance with another embodiment of the present invention.

FIG. 7 shows a schematic diagram of an RF delivery configuration in accordance with another embodiment of the present invention. In the example of FIG. 7, an integrated match circuit 704 allows RF power to be delivered from RF generator 201, RF generator 701, or both to selected or all of chamber electrodes 703 (i.e., 703-1, 703-2, . . . 703-n). Integrated match circuit 704 may include a combiner for combining the output signals of RF generator 201 and RF generator 701. RF generator 701 may be a so-called low-frequency RF generator operating at a frequency of about 400 KHz and having an output impedance of about 50 Ω, for example. The output signal of RF generator 701 is coupled to an electrode 703 via a coaxial cable 702, which is a 50 Ω cable in one embodiment. Integrated match circuit 704 may include a fixed-match (e.g., fixed-match 207) for each chamber electrode 703. A splitter 705 allows the output of integrated match 704 to be fed to chamber electrodes 703. In the example of FIG. 7, RF generator 201, coaxial cable 202, auto-match 203, connection scheme 204, and VI probe 205 function as in the configuration of FIG. 2.

Figure 9:
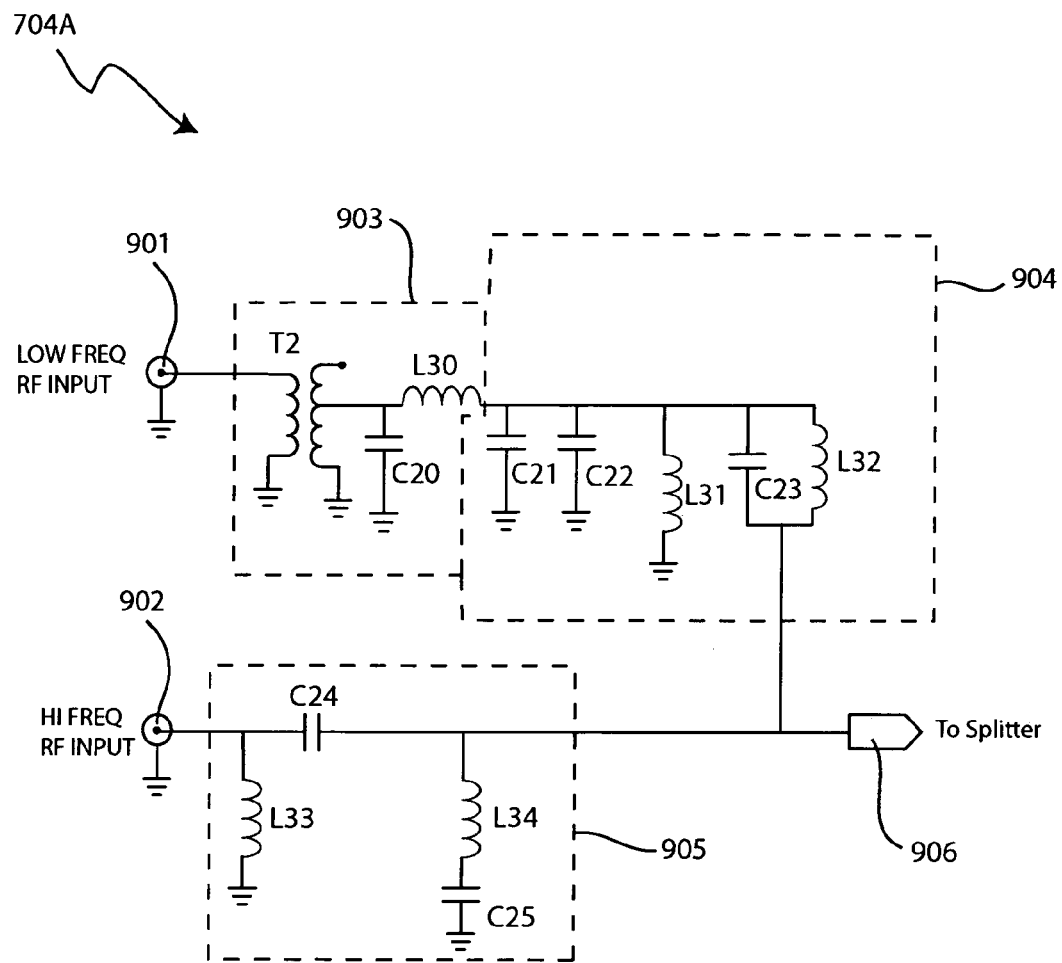
FIG. 9 shows a schematic diagram of an integrated match circuit in accordance with an embodiment of the present invention.

FIG. 9 shows a schematic diagram of an integrated match circuit 704A in accordance with an embodiment of the present invention. Integrated match circuit 704A is a specific embodiment of the integrated match circuit 704 shown in FIG. 7. Referring to FIG. 9, integrated match circuit 704A comprises a low frequency fixed-match 903 and a high-frequency fixed match 905. Fixed-match 903 accepts a low-frequency RF signal at a node 901, while fixed-match 905 accepts a high frequency RF signal at a node 902. Fixed-match 903 transforms an impedance seen at its output to match to the characteristic impedance of cable 702 and output impedance of RF generator 701 (see FIG. 7) at node 901. Fixed-match 905 transforms an impedance seen at node 906 to an impedance that is within the tuning range of an auto-match 203 coupled to node 902. A combiner circuit 904 allows the output of fixed-match 903 to be combined with that of fixed match 905. The output of integrated match circuit 704A at node 906 is provided to a splitter for delivery to the electrodes of the plasma processing chamber. In one embodiment, the components of integrated match circuit 704A have the approximate values shown in Table 4.

TABLE 4

EXAMPLE COMPONENT VALUES OF AN INTEGRATED MATCH CIRCUIT

| Component | Value |
|---|---|
| T2 (7-position match transformer) | Low-Frequency Input: ~50 Ω<br>Output: adjustable from 40 Ω to 250 Ω (set to ~50 Ω) |
| C20 | 120 pF |
| C21 | 500 pF |
| C22 | 500 pF |
| C23 | 100 pF |
| C24 | 750 pF |
| C25 | 750 pF |
| L30 | 2 µH |
| L31 | 53 µH |
| L32 | 1.3 µH |
| L33 | 0.25 µH |
| L34 | 0.03 µH |

Figure 8:
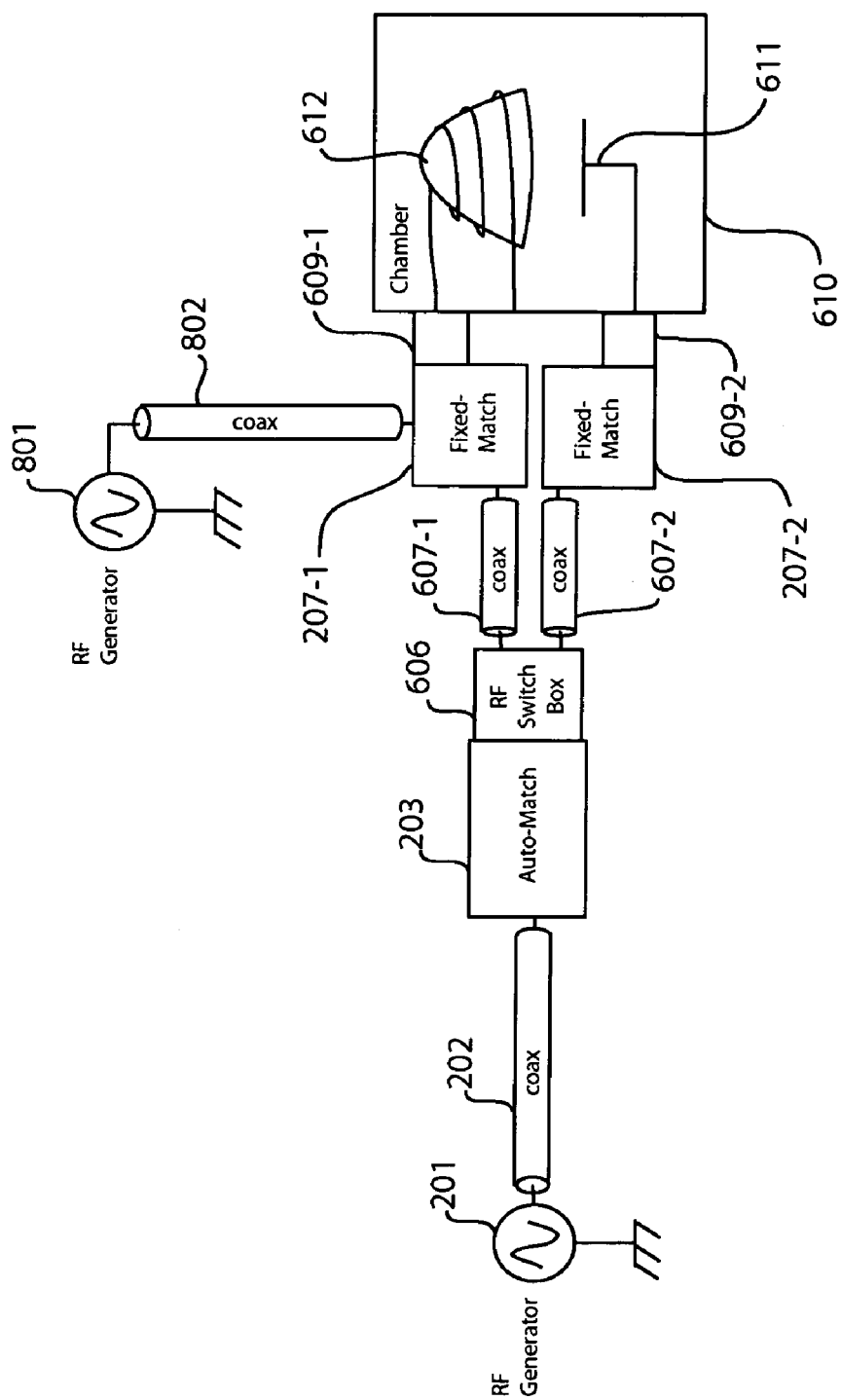
FIG. 8 shows a schematic diagram of an RF delivery configuration in accordance with another embodiment of the present invention.

FIG. 8 shows a schematic diagram of an RF delivery configuration in accordance with another embodiment of the present invention. In the example of FIG. 8, RF power from an RF generator 801 is coupled to dome 612 of plasma processing chamber 610 via a coaxial cable 802, fixed-match 207-1, and connection scheme 609-1 (see also FIG. 6). RF generator 801 may be a low-frequency RF generator operating at a frequency of about 400 KHz and having an output impedance of about 50 Ω, for example. In one embodiment, coaxial cable 802 has a characteristic impedance of about 50 Ω. RF switch box 606 allows RF power from RF generator 201 to be coupled to either dome 612 or chuck 611 depending on the process to be performed in plasma processing chamber 610. Fixed-match 207-2 is paired with auto-match 203 when RF switch box 606 is configured to switch RF generator 201 signal to chuck 611. Otherwise, auto-match 203 is paired with fixed-match 207-1. The other components of the configuration of FIG. 8 have already been discussed in connection with FIGS. 2 and 6.

Improved RF delivery configurations in a plasma processing system have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A system for delivering radio frequency (RF) power to a plasma processing system, the system comprising:
   an automatic impedance matching network configured to receive RF power from an RF generator;
   a fixed impedance matching network coupled between the automatic impedance matching network and a plasma processing chamber, the fixed impedance matching network configured to transform a first impedance presented by the chamber to a second impedance that allows the automatic impedance matching network to operate within a tuning range; and
   a voltage-current (VI) probe coupled between the automatic impedance matching network and the fixed impedance matching network.

2. The system of claim 1 further comprising:
   an absorptive filter coupled between the automatic impedance matching network and the fixed impedance matching network.

3. The system of claim 1 wherein the fixed impedance matching network comprises:
   a first end coupled to the automatic impedance matching network and a second end coupled to the plasma processing chamber;
   a first capacitor coupled to the second end;
   an inductor coupled to the first end, the inductor being serially coupled to the first capacitor; and
   a second capacitor coupled to a node between the inductor and the first capacitor, the second capacitor being coupled to a common potential.

4. The system of claim 1 further comprising:
   a 50 Ohm coaxial cable coupling the RF generator to the automatic impedance matching network; and
   a 30 Ohm coaxial cable coupling the fixed impedance matching network to the automatic impedance matching network.

5. The system of claim 1 wherein the tuning range is at least 3:1 voltage standing wave ratio (VSWR) circle around 30 Ohms.

6. The system of claim 1 further comprising:
   an RF switch box configured to switch the RF generator signal from a first electrode to a second electrode in the plasma processing chamber.

7. The system of claim 1 wherein the second impedance is centered around 30 Ohms.

8. The system of claim 1 wherein the plasma processing chamber comprises a high density plasma (HDP) chemical vapor deposition (CVD) chamber.

9. A method of providing radio frequency (RF) power to a plasma processing system, the method comprising:
   transforming an impedance presented by a plasma processing chamber to a first impedance matched to a characteristic impedance of a first connection scheme; and
   transforming the impedance of the first connection scheme to a second impedance matched to a characteristic impedance of a second connection scheme coupled to an RF generator; and
   measuring at least one of a current, a voltage or a phase at a point between an automatic matching network and a fixed matching network.

10. The method of claim 9 wherein the first connection scheme comprises a 30 Ohm coaxial cable.

11. The method of claim 9 wherein the second connection scheme comprises a 50 Ohm coaxial cable.

12. The method of claim 9 wherein the impedance of the first connection scheme is different from the impedance of the second connection scheme.

13. A system for coupling a radio frequency (RF) generator to a plasma processing chamber, the system comprising:
   a first RF generator coupled to an automatic impedance matching network;
   a plasma processing chamber;
   a first fixed impedance matching network coupled between the plasma processing chamber and the automatic impedance matching network; and
   a voltage-current probe coupled between the automatic matching network and the first fixed impedance matching network.

14. The system of claim 13 further comprising:
   an RF switch box coupled between the automatic impedance matching network and the first fixed impedance matching network.

15. The system of claim 14 wherein the RF switch box is configured to switch the first RF generator signal to a first electrode or a second electrode of the plasma processing chamber.

16. The system of claim 13 further comprising:
   a second RF generator; and
   a second fixed impedance matching network coupled between the second RF generator and the plasma processing chamber.

17. The system of claim 16 wherein the first RF generator comprises a high-frequency RF generator and the second RF generator comprises a low-frequency RF generator.

18. The system of claim 13 further comprising:
   a combiner configured to combine an output of the first RF generator with an output of a second RF generator.

19. The system of claim 13 further comprising:
   a splitter configured to split an RF generator signal for delivery to a plurality of electrodes in the plasma processing chamber.

20. An apparatus for delivering RF power to a plasma processing chamber, the apparatus comprising:
   a high-frequency fixed impedance matching network coupled to receive a high-frequency RF signal from a high-frequency RF generator by way of an automatic impedance matching network;

a low-frequency fixed impedance matching network coupled to receive a low-frequency RF signal from a low-frequency RF generator; and a combiner configured to combine an output of the high-frequency fixed impedance matching network with an output of the low-frequency fixed impedance matching network.

21. A system for delivering radio frequency (RF) power to a plasma processing system, the system comprising:

an automatic impedance matching network configured to receive RF power from an RF generator;

a fixed impedance matching network coupled between the automatic impedance matching network and a plasma processing chamber, the fixed impedance matching network configured to transform a first impedance presented by the chamber to a second impedance that allows the automatic impedance matching network to operate within a tuning range; and an absorptive filter coupled between the automatic impedance matching network and the fixed impedance matching network.

22. A system for delivering radio frequency (RF) power to a plasma processing system, the system comprising:

an automatic impedance matching network configured to receive RF power from an RF generator; and a fixed impedance matching network coupled between the automatic impedance matching network and a plasma processing chamber, the fixed impedance matching network configured to transform a first impedance presented by the chamber to a second impedance that allows the automatic impedance matching network to operate within a tuning range;

wherein the fixed impedance matching network comprises:

a first end coupled to the automatic impedance matching network and a second end coupled to the plasma processing chamber;

a first capacitor coupled to the second end;

an inductor coupled to the first end, the inductor being serially coupled to the first capacitor; and a second capacitor coupled to a node between the inductor and the first capacitor, the second capacitor being coupled to a common potential.

23. A system for delivering radio frequency (RF) power to a plasma processing system, the system comprising:

an automatic impedance matching network configured to receive RF power from an RF generator;

a fixed impedance matching network coupled between the automatic impedance matching network and a plasma processing chamber, the fixed impedance matching network configured to transform a first impedance presented by the chamber to a second impedance that allows the automatic impedance matching network to operate within a tuning range;

a 50 Ohm coaxial cable coupling the RF generator to the automatic impedance matching network; and a 30 Ohm coaxial cable coupling the fixed impedance matching network to the automatic impedance matching network.

24. A system for delivering radio frequency (RF) power to a plasma processing system, the system comprising:

an automatic impedance matching network configured to receive RF power from an RF generator; and a fixed impedance matching network coupled between the automatic impedance matching network and a plasma processing chamber, the fixed impedance matching network configured to transform a first impedance presented by the chamber to a second impedance that allows the automatic impedance matching network to operate within a tuning range;

wherein the tuning range is at least 3:1 voltage standing wave ratio (VSWR) circle around 30 Ohms.

25. A system for delivering radio frequency (RF) power to a plasma processing system, the system comprising:

an automatic impedance matching network configured to receive RF power from an RF generator; and a fixed impedance matching network coupled between the automatic impedance matching network and a plasma processing chamber, the fixed impedance matching network configured to transform a first impedance presented by the chamber to a second impedance that allows the automatic impedance matching network to operate within a tuning range; and an RF switch box configured to switch the RF generator signal from a first electrode to a second electrode in the plasma processing chamber.

26. A system for delivering radio frequency (RF) power to a plasma processing system, the system comprising:

an automatic impedance matching network configured to receive RF power from an RF generator; and a fixed impedance matching network coupled between the automatic impedance matching network and a plasma processing chamber, the fixed impedance matching network configured to transform a first impedance presented by the chamber to a second impedance that allows the automatic impedance matching network to operate within a tuning range;

wherein the second impedance is centered around 30 Ohms.

27. A method of providing radio frequency (RF) power to a plasma processing system, the method comprising:

transforming an impedance presented by a plasma processing chamber to a first impedance matched to a characteristic impedance of a first connection scheme; and transforming the impedance of the first connection scheme to a second impedance matched to a characteristic impedance of a second connection scheme coupled to an RF generator;

wherein the first connection scheme comprises a 30 Ohm coaxial cable.

28. A system for coupling a radio frequency (RF) generator to a plasma processing chamber, the system comprising:

a first RF generator coupled to an automatic impedance matching network;

a plasma processing chamber;

a first fixed impedance matching network coupled between the plasma processing chamber and the automatic impedance matching network; and an RF switch box coupled between the automatic impedance matching network and the first fixed impedance matching network.

29. The system of claim 28 wherein the RF switch box is configured to switch the first RF generator signal to a first electrode or a second electrode of the plasma processing chamber.

30. A system for coupling a radio frequency (RF) generator to a plasma processing chamber, the system comprising:

a first RF generator coupled to an automatic impedance matching network;
a plasma processing chamber;
a first fixed impedance matching network coupled between the plasma processing chamber and the automatic impedance matching network;
a second RF generator; and
a second fixed impedance matching network coupled between the second RF generator and the plasma processing chamber;
wherein the first RF generator comprises a high-frequency RF generator and the second RF generator comprises a low-frequency RF generator.

31. A system for coupling a radio frequency (RF) generator to a plasma processing chamber, the system comprising:
a first RF generator coupled to an automatic impedance matching network;
a plasma processing chamber;
a first fixed impedance matching network coupled between the plasma processing chamber and the automatic impedance matching network; and
a combiner configured to combine an output of the first RF generator with an output of a second RF generator.

* * * * *